US012768043B2

(12) United States Patent
Singh et al.

(10) Patent No.: US 12,768,043 B2
(45) Date of Patent: Oct. 20, 2026

(54) HARDWARE TO UNIFORMLY DISTRIBUTE ACTIVE SPECIES FOR SEMICONDUCTOR FILM PROCESSING

(71) Applicant: Applied Materials, Inc., Santa Clara, CA (US)

(72) Inventors: Harpreet Singh, Tracy, CA (US); Jallepally Ravi, San Ramon, CA (US); Zubin Huang, Santa Clara, CA (US); Manjunatha Koppa, Bangalore (IN); Sandesh Yadamane, Bangalore (IN); Srinivas Tokur Mohana, Bangalore (IN); Shreyas Patil Shanthaveeraswamy, Bangalore (IN); Kai Wu, Palo Alto, CA (US); Peiqi Wang, Campbell, CA (US); Mingrui Zhao, Newark, CA (US)

(73) Assignee: Applied Materials, Inc., Santa Clara, CA (US)

( * ) Notice: Subject to any disclaimer, the term of this patent is extended or adjusted under 35 U.S.C. 154(b) by 526 days.

(21) Appl. No.: 17/663,695

(22) Filed: May 17, 2022

(65) Prior Publication Data

US 2023/0374660 A1 Nov. 23, 2023

(51) Int. Cl.
*C23C 16/455* (2006.01)
*C23C 16/06* (2006.01)
*H10P 14/40* (2026.01)

(52) U.S. Cl.
CPC ........ *C23C 16/45561* (2013.01); *C23C 16/06* (2013.01); *C23C 16/45591* (2013.01); *H10P 14/418* (2026.01)

(58) Field of Classification Search
CPC .............. C23C 16/45561; C23C 16/06; C23C 16/45591; C23C 16/0263; C23C 16/45574; C23C 16/45565; H01L 21/28568; H01L 21/76856; H01L 21/76876
USPC ........................ 118/715; 156/345.33, 345.34
See application file for complete search history.

(56) References Cited

U.S. PATENT DOCUMENTS

| | | | |
|---|---|---|---|
| 5,812,403 A | 9/1998 | Fong et al. | |
| 6,878,206 B2 | 4/2005 | Tzu et al. | |
| 8,900,364 B2 | 12/2014 | Wright | |
| 8,980,763 B2 | 3/2015 | Wang et al. | |

(Continued)

FOREIGN PATENT DOCUMENTS

| | | |
|---|---|---|
| JP | 2013-084602 A | 5/2013 |
| JP | 2014-192219 A | 10/2014 |

(Continued)

OTHER PUBLICATIONS

International Search Report and Written Opinion for Application No. PCT/US2023/020318 dated Aug. 23, 2023.

(Continued)

*Primary Examiner* — Rudy Zervigon
(74) *Attorney, Agent, or Firm* — Patterson + Sheridan, LLP

(57) ABSTRACT

A substrate processing system is provided having a processing chamber. The processing chamber includes a lid plate, one or more chamber sidewalls, and a chamber base that collectively define a processing volume. An annular plate is coupled to the lid plate, and an edge manifold is fluidly coupled to the processing chamber through the annular plate and the lid plate. The substrate processing system includes a center manifold that is coupled to the lid plate.

17 Claims, 6 Drawing Sheets

(56) References Cited

U.S. PATENT DOCUMENTS

| | | | |
|---|---|---|---|
| 9,885,117 B2 | 2/2018 | Lubomirsky et al. | |
| 10,256,079 B2 | 4/2019 | Lubomirsky et al. | |
| 11,598,004 B2 * | 3/2023 | Panavalappil Kumarankutty ....... | C23C 16/45574 |
| 2005/0173569 A1 * | 8/2005 | Noorbakhsh ..... | C23C 16/45565 239/690 |
| 2007/0256785 A1 * | 11/2007 | Pamarthy ............ | H01J 37/3244 438/689 |
| 2009/0211707 A1 * | 8/2009 | Chao ................. | C23C 16/45574 118/728 |
| 2009/0218317 A1 * | 9/2009 | Belen ................ | C23C 16/45565 156/345.34 |
| 2014/0273451 A1 | 9/2014 | Wang et al. | |
| 2014/0291286 A1 * | 10/2014 | Okayama .......... | C23C 16/45519 239/548 |
| 2014/0342569 A1 | 11/2014 | Zhu et al. | |
| 2019/0100839 A1 | 4/2019 | Bansal et al. | |
| 2020/0157682 A1 * | 5/2020 | Sung ................. | C23C 16/45561 |
| 2020/0263301 A1 | 8/2020 | Bansal et al. | |
| 2021/0142984 A1 | 5/2021 | Ruan et al. | |
| 2022/0130687 A1 | 4/2022 | Rajeev et al. | |

FOREIGN PATENT DOCUMENTS

| | | |
|---|---|---|
| WO | 2021055990 A1 | 3/2021 |
| WO | 2022/086869 A1 | 4/2022 |

OTHER PUBLICATIONS

Japanese Office Action for Application No. 2024-568599 Dated Nov. 6, 2025.

Office Action from South Korean Patent Application No. 10-2024-7040981, dated Jul. 1, 2026.

* cited by examiner

HARDWARE TO UNIFORMLY DISTRIBUTE ACTIVE SPECIES FOR SEMICONDUCTOR FILM PROCESSING

BACKGROUND

Field

Embodiments herein are directed to systems used in electronic device manufacturing, and more particularly, to gas distribution systems used for forming structures containing tungsten and molybdenum in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity and high melting point, tungsten is also commonly used to form bit lines and word lines used to address individual memory cells in a memory cell array of a dynamic random-access memory (DRAM) device.

As circuit densities increase and device features continue to shrink to meet the demands of the next generation of semiconductor devices, reliably producing tungsten features has become increasingly challenging. The advances in integrated circuit technology have necessitated improved methods of depositing refractory metals, particularly tungsten, to enhance uniform deposition over substrates. Conventional methods of deposition that use point source distribution of active species to the substrate do not enable tunability of the active species between the center and edge of the substrate. Layer thickness uniformity from center to edge of the substrate is impacted by the inability to tune the deposition gases.

Accordingly, there is a need for a system to tune gas distribution of radical species from center to edge of substrates.

SUMMARY

In some embodiments, a substrate processing system is provided having a processing chamber. The processing chamber includes a lid plate, one or more chamber sidewalls, and a chamber base that collectively define a processing volume. An annular plate is coupled to the lid plate, and an edge manifold is fluidly coupled to the processing chamber through the annular plate and the lid plate. The substrate processing system includes a center manifold that is coupled to the lid plate.

In some embodiments, a gas delivery system is provided including a lid plate having a first major surface and a second major surface opposing the first major surface. An annular plate is coupled to the first major surface of the lid plate. The gas delivery system includes a blocker plate is coupled to the second major surface of the lid plate. The gas delivery system includes a center manifold fluidly coupled to an opening of the lid plate. An edge manifold is fluidly coupled to the center manifold and the annular plate.

In some embodiments, a method of processing a substrate is provided including depositing a nucleation layer by exposing the substrate to a refractory metal-containing gas using a gas delivery system. The method includes exposing the substrate to a radical species, the radical species being supplied to an edge region of a blocker plate disposed over the substrate, the edge region being fluidly isolated from an inner region of the blocker plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
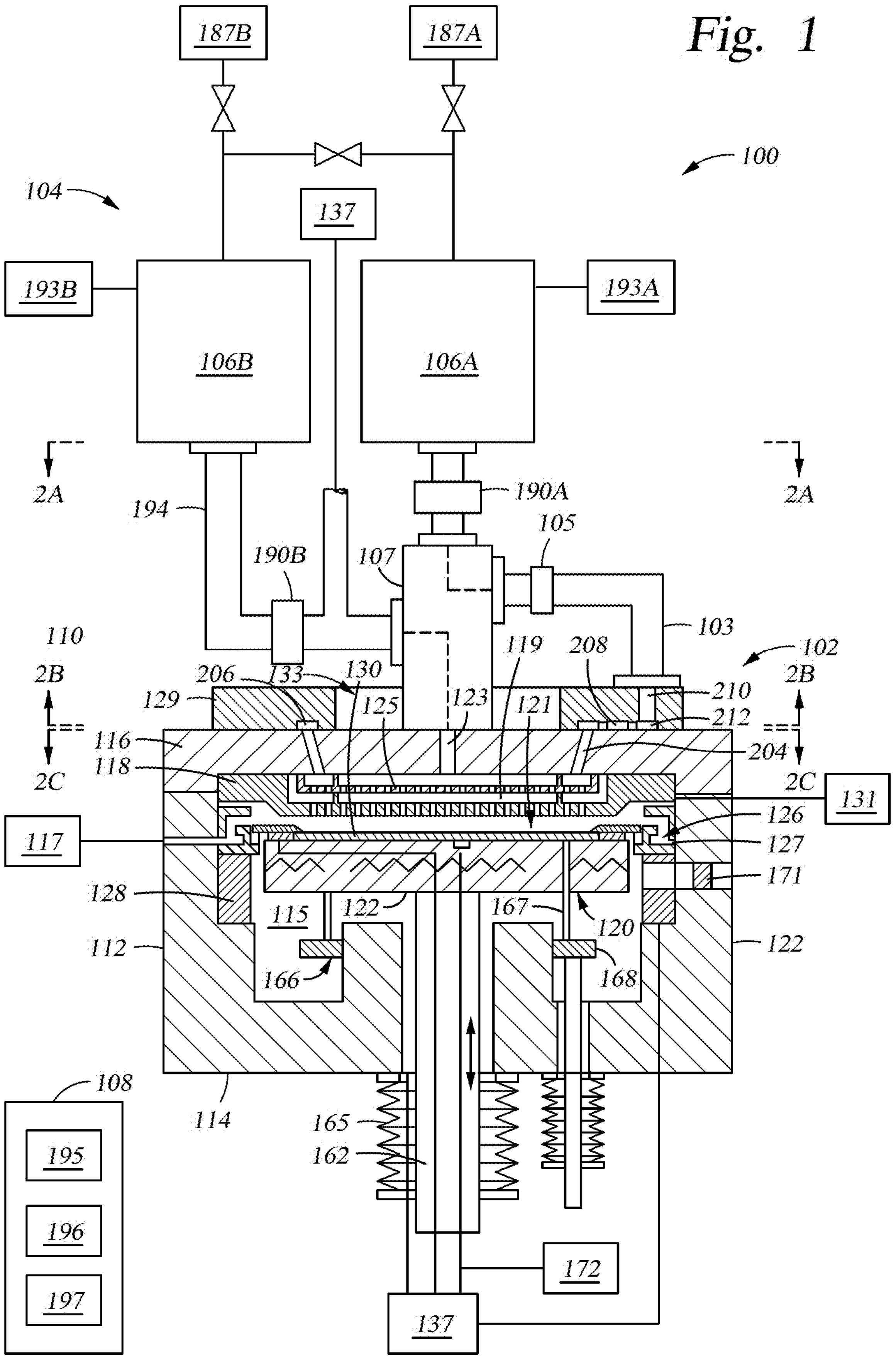
FIG. 1 illustrates a schematic side view of a processing system, according to some embodiments.

FIG. 1 schematically illustrates a processing system 100 that may be used to perform the processing methods described herein. Here, the processing system is configured to provide the processing conditions for processing substrates and for cleaning an interior of the processing chamber 102.

As shown in FIG. 1, the processing system 100 includes a processing chamber 102, a gas delivery system 104 fluidly coupled to the processing chamber 102, and a system controller 108. The processing chamber 102 includes a chamber lid assembly 110, one or more sidewalls 112, and a chamber base 114, which collectively define a processing volume 115. The processing volume 115 is fluidly coupled to an exhaust 117, such as one or more vacuum pumps, used to maintain the processing volume 115 at sub-atmospheric conditions and to evacuate processing gases and processing by-products therefrom.

The chamber lid assembly 110 includes a lid plate 116 and a showerhead 118 coupled to the lid plate 116 to define a gas distribution volume 119 therewith. The showerhead 118 faces a substrate support assembly 120 disposed in the processing volume 115. As discussed below, the substrate support assembly 120 is configured to move a substrate support 122, and thus a substrate 130 disposed on the substrate support 122, between a raised substrate processing position (as shown) and a lowered substrate transfer position (not shown). When the substrate support assembly 120 is in the raised substrate processing position, the showerhead 118 and the substrate support 122 define a processing region 121.

The gas delivery system 104 is fluidly coupled to the processing chamber 102 through a center manifold 107 and edge manifold 103. The center manifold 107 is coupled to the lid plate 116 and fluidly coupled to the processing chamber 102 through center gas inlet 123 disposed through the lid plate 116. Processing or cleaning gases delivered, by use of the gas delivery system 104, flow through the center gas inlet 123 into the gas distribution volume 119 and are distributed into the processing region 121 through the showerhead 118. In some embodiments, the processing or cleaning gases flow through the edge manifold 103. The edge manifold 103 is coupled to an annular plate 129 disposed on an outer surface of the lid plate 116. The edge manifold 103 is fluidly coupled to the processing chamber 102 through an opening 210 of the annular plate 129 and through edge gas holes 204 of the lid plate 116. An isolation valve 105 is disposed on the edge manifold 103 and is configured to control a gas flow ratio through the edge manifold 103. The opening 210 of the annular plate 129 is fluidly coupled to the edge manifold 103 and to channels 212 disposed within the annular plate 129. The channels 212 are fluidly coupled to the edge gas holes 204 disposed in the lid plate 116.

The edge gas holes 204 are channels that extend from an outer surface to an inner surface of the lid plate 116. In some embodiments, the edge gas holes 204 are arranged in a first shape that approximates the shape of the annular plate, such as in a circular shape. In some embodiments, about 15 to about 25, such as about 17 to about 20 edge gas holes 204 are disposed about the lid plate 116. In some embodiments, the edge gas holes 204 are angled radially inward from the outer surface to the inner surface of the lid plate 116. Outlets of the edge gas holes 204 at the inner surface of the lid plate 116 form a second shape having a different size from the first shape at the outer surface of the lid plate. It has been discovered that angling the edge gas holes enables space for components to be fixed to the lid plate 116 in a central opening 133 of the annular plate 129, such as the center manifold 107. It has further been discovered that angling the edge gas holes enables providing gas to a particular volume such as proximate to an edge of the substrate disposed within the processing chamber. In some embodiments, a diameter of the first shape is the same or greater than the diameter of the second shape, such as about 1% greater, such as about 2% greater, such as about 5% greater, such as about 8% to about 10% greater.

In some embodiments, the chamber lid assembly 110 further includes a perforated blocker plate 125 disposed between the center gas inlet 123 and the showerhead 118. In those embodiments, gases flowed into the gas distribution volume 119 are first diffused by the blocker plate 125 to, together with the showerhead 118, provide a more uniform or desired distribution of gas flow into the processing region 121.

The processing gases and processing by-products are evacuated radially outward from the processing region 121 through an annular channel 126 that surrounds the processing region 121. The annular channel 126 may be formed in a first annular liner 127 disposed radially inward of the one or more sidewalls 112 (as shown) or may be formed in the one or more sidewalls 112, which are used to protect the interior surfaces. In some embodiments, the processing chamber 102 includes one or more second liners 128 of the one or more sidewalls 112 or chamber base 114 from corrosive gases and/or undesired material deposition.

In some embodiments, a purge gas source 137 includes a first connection that is in fluid communication with the processing volume 115 so that it can be used to flow a chemically inert purge gas, such as argon (Ar), into a region disposed at a periphery of a substrate and/or beneath the substrate disposed on the substrate support 122, e.g., through the opening in the chamber base 114 surrounding a support shaft 162 of the substrate support assembly 120. The purge gas may be used to create a region of positive pressure above the substrate 130 disposed on the substrate support 122 (when compared to below the substrate) during substrate processing. In some configurations, the purge gas is introduced through the chamber base 114 so that it flows upwardly therefrom and around the edges of the substrate support 122 to be evacuated from the processing volume 115 through the annular channel 126. In this configuration, the purge gas reduces undesirable material deposition on surfaces beneath the substrate support 122 by reducing and/or preventing the flow of material precursor gases thereinto.

The substrate support assembly 120 includes the movable support shaft 162 that sealingly extends through the chamber base 114, such as being surrounded by bellows 165 in the region below the chamber base 114, and the substrate support 122, which is disposed on the movable support shaft 162. To facilitate substrate transfer to and from the substrate support 122, the substrate support assembly 120 includes a lift pin assembly 166 comprising a plurality of lift pins 167 coupled to or disposed in engagement with a lift pin hoop 168. The plurality of lift pins 167 are movably disposed in openings formed through the substrate support 122.

The substrate 130 is transferred to and from the substrate support 122 through a door 171, e.g., a slit valve disposed in one of the one or more sidewalls 112. Here, one or more openings in a region surrounding the door 171, e.g., openings in a door housing, are fluidly coupled to a purge gas source 137, e.g., an argon (Ar) gas source. The purge gas is used to prevent processing and cleaning gases from contacting and/or degrading a seal surrounding the door, thus extending the useful lifetime thereof.

The substrate support 122 is configured for vacuum chucking where the substrate 130 is secured to the substrate support 122 by applying a vacuum to an interface between the substrate 130 and the substrate receiving surface, such as with a vacuum source 172.

In some embodiments, the processing chamber 102 is configured for direct plasma processing. In those embodiments, the showerhead 118 may be electrically coupled to a first power supply 131, such as an RF power supply, which supplies power to form and maintain a capacitively coupled plasma using processing gases flowed into the processing region 121 through the showerhead 118. In some embodiments, the processing chamber 102 alternately comprises an inductively coupled plasma generator (not shown), and a plasma is formed through inductively coupling an RF power through an antenna disposed on the processing chamber 102 to the processing gas disposed in the processing volume 115.

The processing system 100 is advantageously configured to perform each of the tungsten nucleation, and bulk tungsten deposition processes without removing the substrate 130 from the processing chamber 102. The gases used to perform the individual processes, and to clean residues from the interior surfaces of the processing chamber, are delivered to the processing chamber 102 using the gas delivery system 104 fluidly coupled thereto.

Generally, the gas delivery system 104 includes one or more remote plasma sources, here the first and second radical generator 106A-B, a deposition gas source 187A, 187B, and a conduit system 194 fluidly coupling the radical generators 106A-B and the deposition gas source 140 to the lid assembly 110. The gas delivery system 104 further includes a plurality of isolation valves, here first and second valves 190A-B, respectively disposed between the radical generators 106A-B and the lid plate 116, which may be used to fluidly isolate each of the radical generators 106A-B from the processing chamber 102 and from one another. Deposition gases, e.g., tungsten-containing precursors, molybdenum-containing precursors, and reducing agents, are delivered from the deposition gas source 140 to the processing chamber 102 using the conduit system 194.

Each of the radical generators 106A-B is coupled to a respective power supply 193A-B, such as a radio frequency (RF) power supply. The power supplies 193A-B are used to ignite and maintain a plasma that is delivered to the plasma chamber volumes using gases provided from a corresponding first or second gas source 187A-B fluidly coupled thereto. In some embodiments, the first radical generator 106A may be used to ignite and maintain a treatment plasma from a non-halogen-containing gas mixture delivered to the first plasma chamber volume from the first gas source 187A. The second radical generator 106B may be used to generate cleaning radicals used in a chamber clean process, by igniting and maintaining a cleaning plasma from a halogen-containing gas mixture (e.g., HCl, $Cl_2$, $F_2$) delivered to the second plasma chamber volume from the second gas source 187B.

Operation of the processing system 100 is facilitated by the system controller 108. The system controller 108 includes a programmable central processing unit, here the CPU 195, which is operable with a memory 196 (e.g., non-volatile memory) and support circuits 197. The CPU 195 is one of any form of general-purpose computer processor used in an industrial setting, such as a programmable logic controller (PLC), for controlling various chamber components and sub-processors. The memory 196, coupled to the CPU 195, facilitates the operation of the processing chamber. The support circuits 197 are conventionally coupled to the CPU 195 and comprise cache, clock circuits, input/output subsystems, power supplies, and the like, and combinations thereof coupled to the various components of the processing system 100 to facilitate control of substrate processing operations therewith.

The instructions in memory 196 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

Figure 2A:
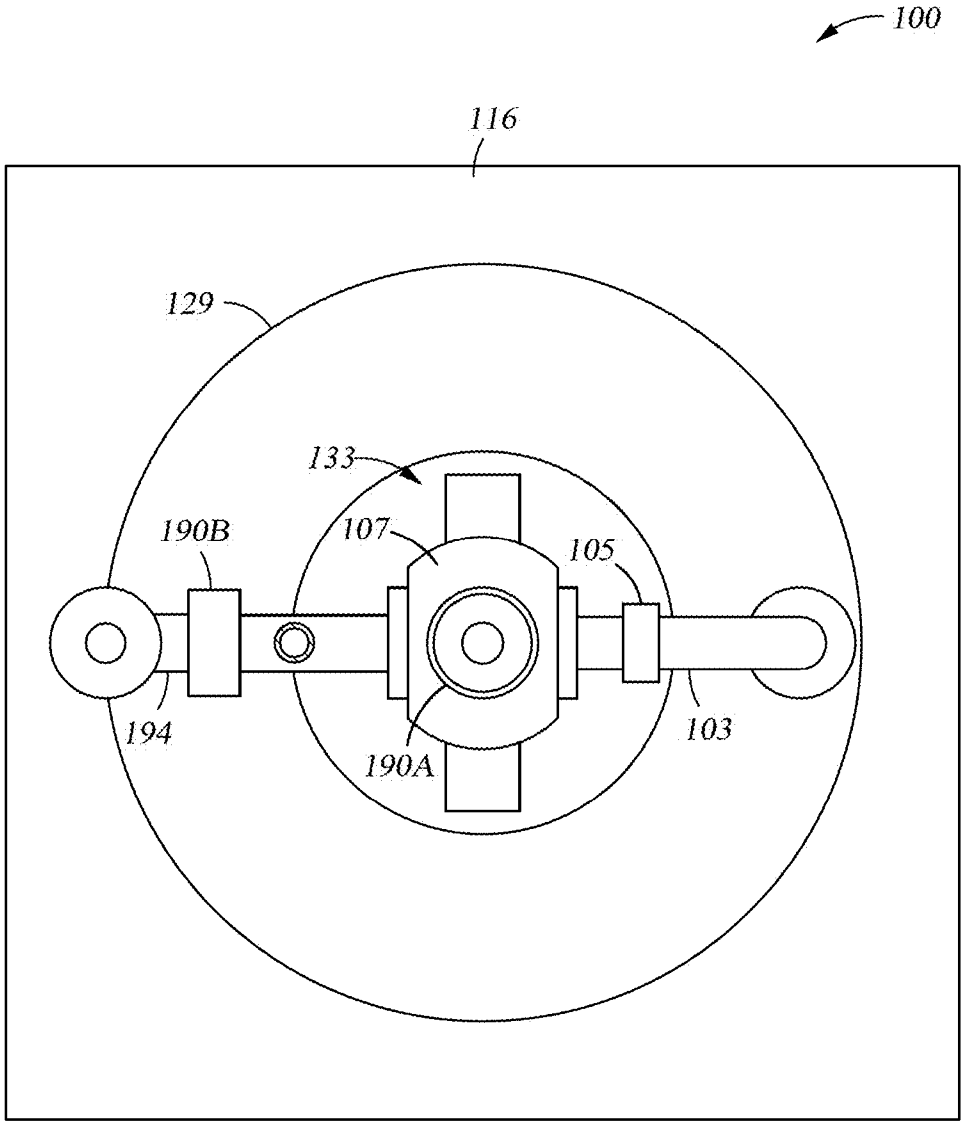
FIG. 2A illustrates a top view of the gas delivery system, according to some embodiments.
Figure 2B:
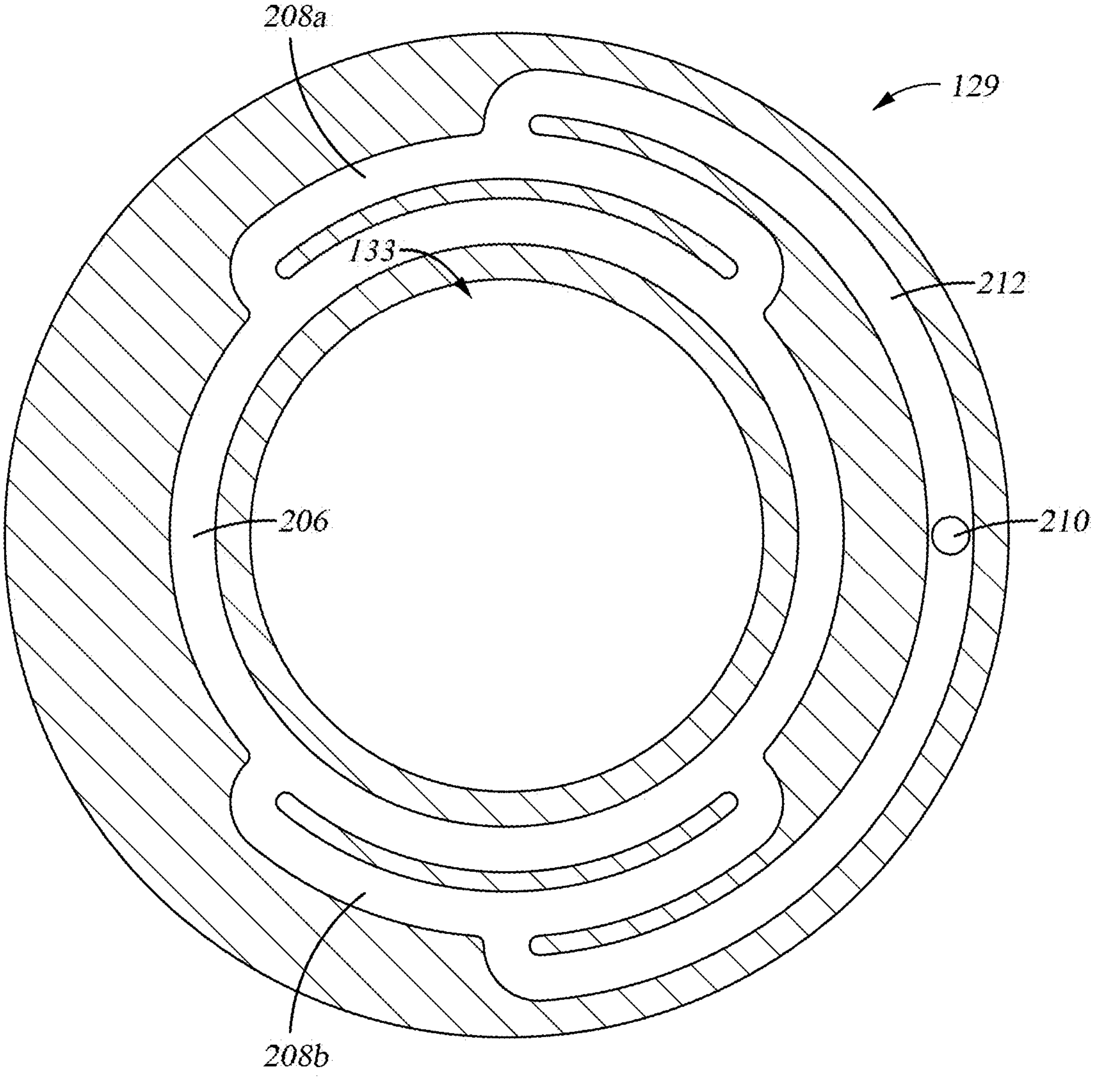
FIG. 2B illustrates a cross-sectional bottom view of an annular plate of the gas delivery system, according to some embodiments.

FIG. 2A is a top view of the gas delivery system 104 and FIG. 2B is a cross-sectional bottom view of the gas delivery system 104. The gas delivery system 104 includes the edge manifold 103 extending from the center manifold 107 to the annular plate 129. The edge manifold 103 is in fluid communication with the annular plate 129 through the opening 210 disposed in the annular plate 129. Although FIGS. 2A and 2B depict a single edge manifold 103 coupled to a single opening 210 in the annular plate 129, additional edge manifolds are also contemplated extending from the center manifold 107 to additional openings in the annular plate 129. Additional manifolds can be equally spaced apart relative to one another and provide enhanced gas distribution. Gas is provided through the edge manifold 103, into the opening 210 and through the outer channel 212 disposed in the edge manifold 103. The outer channel 212 distributes gas at one or more points along an inner channel 206. In some embodiments, the outer channel 212 is coupled to a first intermediate channel 208*a* and a second intermediate channel 208*b*. The first and second intermediate channels 208*a*, 208*b* are each coupled to two or more of the points along the inner channel 206. Although FIG. 2A and FIG. 2B depict four points along the inner channel 206 coupled to the outer channel 212, additional or less points are also contemplated spaced around the inner channel 206, such as two to ten points, such as three or four points.

Figure 2C:
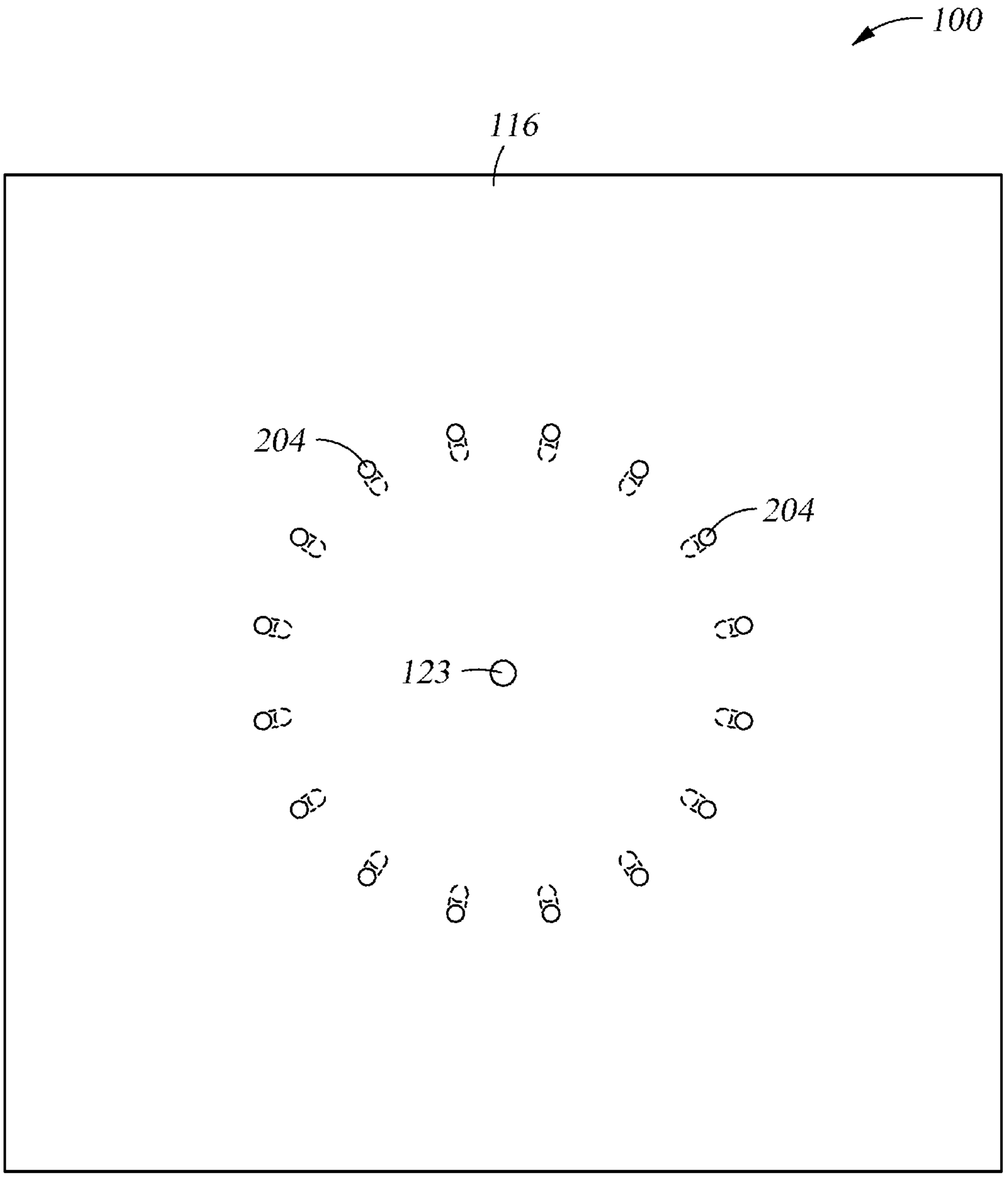
FIG. 2C illustrates a top view of a lid, according to some embodiments.

FIG. 2C depicts a top view of the lid plate 116. The lid plate 116 includes the plurality of edge gas holes 204 arranged in a circular shape similar to the shape of the annular plate 129. The inner channel 206 of the annular plate 129 is fluidly coupled to the edge gas holes 204 of the lid plate 116.

Figure 3:
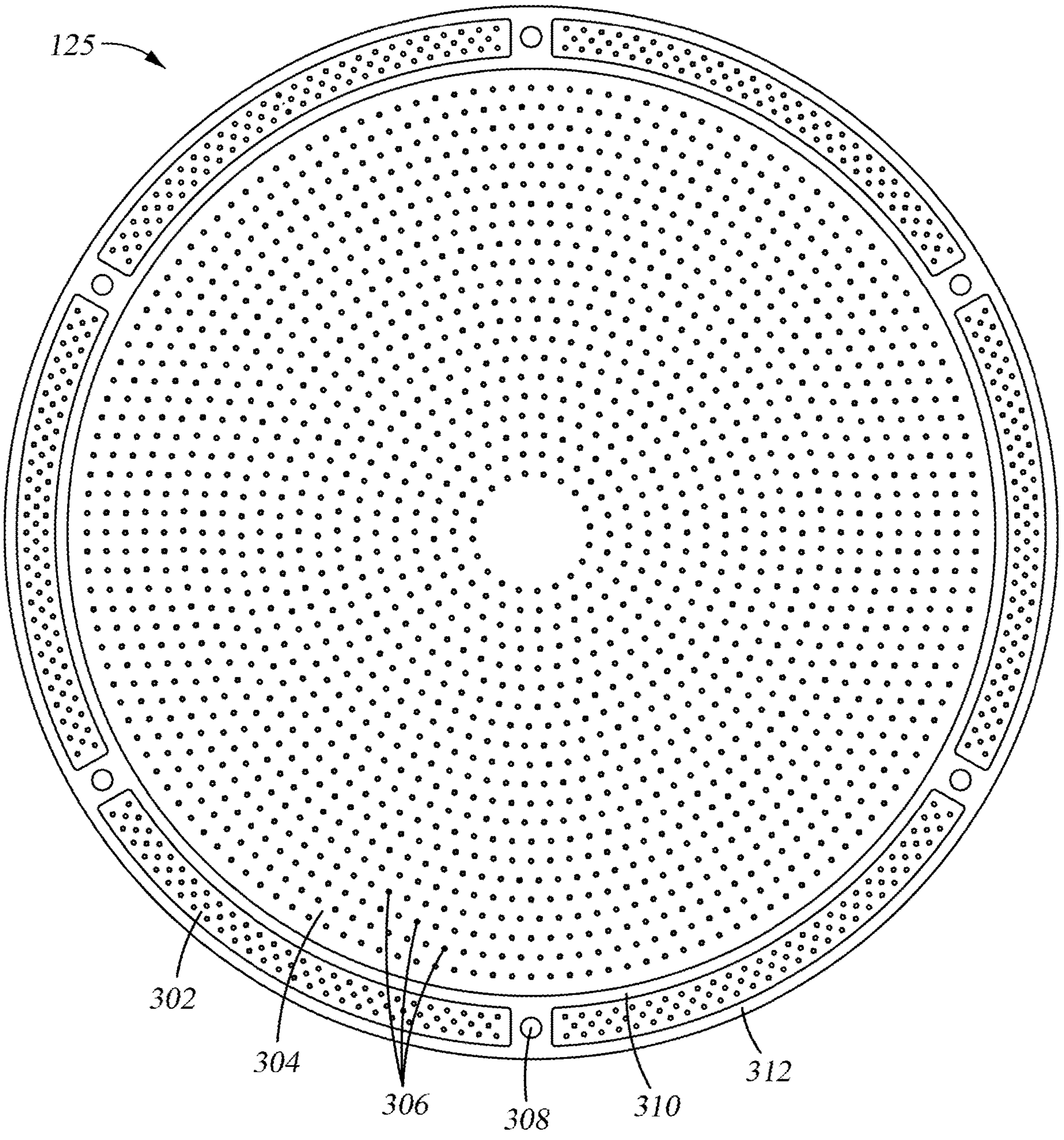
FIG. 3 illustrates a top view of a blocker plate, according to some embodiments.

FIG. 3 depicts a top view of a blocker plate 125. The blocker plate 125 includes an edge region 302 and an inner region 304. Each of the edge gas holes 204 are fluidly coupled to an edge region 302 of blocker plate 125. The center manifold 107 is fluidly coupled to the inner region 304 of the blocker plate 125. Each of the inner region 304 and the edge region 302 include a plurality of apertures 306. The apertures 306 are in fluid communication with the gas distribution volume 119 and diffused through the showerhead 118 into the processing region 121. The gas delivery system described herein enables tuning of process gases between the inner and the edge regions of the substrate disposed below the showerhead 118. The inner and edge region of the substrate correspond to the inner region 304 and the edge region 302 of the blocker plate 125. It has been discovered that tuning between the inner and edge region enables uniform film deposition over the substrate. In contrast, conventional gas distribution assemblies, such as a point source system deliver process gases using an asymmetric radical species delivery path. A conventional point source system includes a single point, such as a center region to direct gas to a center of a gas diffuser, such as a showerhead with or without a blocker plate. As a result, the film thickness near a peripheral portion of the substrate is reduced relative to portions disposed radially inward.

In some embodiments, the tuning of the process gas includes switching gas flow between the edge manifold 103 to the edge region 302 and the center manifold 107 to the inner region 304. In some embodiments, the tuning of the process gas includes co-flowing gas between the edge manifold 103 to the edge region 302 and the center manifold 107 to the inner region 304. The gas flow to the edge region 302 to gas flow to the inner region 304 is about 1:4 to about 4:1, such as about 1:3 to about 1:2, or about 2:1 to about 3:1. In some embodiments, the total volumetric flow rate is about 100 sccm to about 500 sccm of a process gas, such as a gas mixture of nitrogen gas and argon gas. In some embodiments, the process gas flowed for about 5 seconds to about 20 seconds, such as about 10 seconds to about 15 seconds. In some embodiments, the gas flow to the edge region 302 is about 100 sccm to about 200 sccm and the gas flow to the inner region 304 is about 300 sccm to about 400 sccm. In some embodiments, the gas flow to the inner region 304 is about 100 sccm to about 200 sccm and the gas flow to the edge region 302 is about 300 sccm to about 400 sccm.

The edge region 302 is formed between an outer circumferential edge 312 and an inner circumferential partition 310 separating the inner region 304 from the edge region 302. An annular width of the edge region 302 between the outer circumferential edge 312 and the inner circumferential partition 310 is about 0.25" to about 1.0". The inner region 304 includes a diameter of about ratio 5:2. The edge region 302 is separated into a plurality of segments between segment dividers 308, such as about 2 segments to about 8 segments, such as about 4 segments to about 6 segments. It has been discovered that the segment dividers 308 provide a location for mounting holes to secure the blocker plate 125 and enables enhanced flow uniformity through the edge region 302 of the blocker plate 125.

In some embodiments, two or more gases are flowed to the edge manifold 103 simultaneously, such as incubation treatment gases, such as a nitrogen radical-containing gas and an argon-containing gas. The ratio of nitrogen-containing gas and argon-containing gas is tuned based on predetermined process parameters for film deposition. Similarly, a ratio of two or more components of gases can be controlled for flowing gases through the center manifold 107. The center manifold 107 and edge manifold 103 can be controlled independently relative to one another. Although the gas source is depicted in the figures as being coupled to the edge manifold 103 through the center manifold 107, additional gas sources can also be coupled to the edge manifold 103 at other locations along the edge manifold 103.

EXAMPLE

Figure 4:
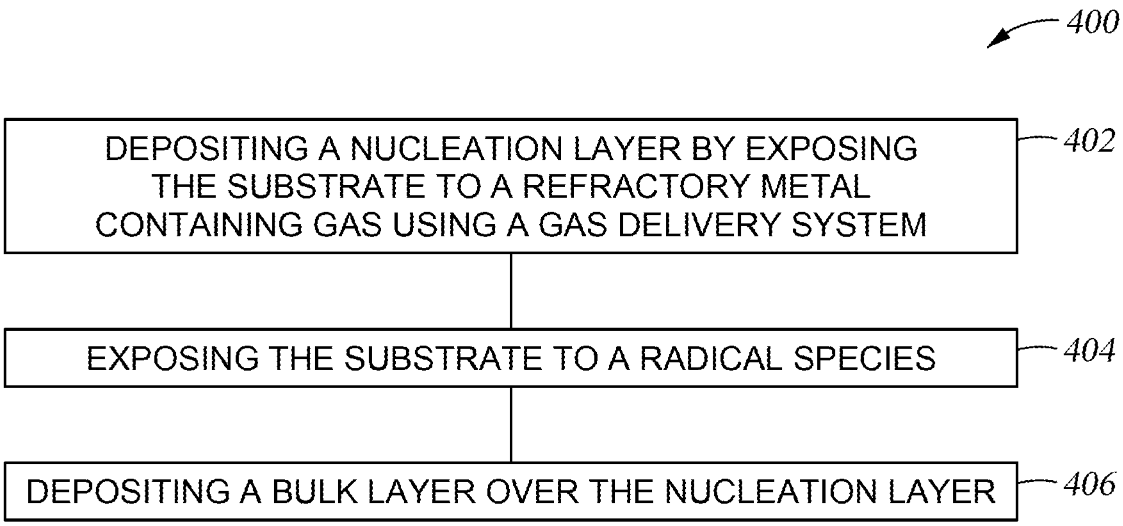
FIG. 4 illustrates a process flow diagram of a method of processing a substrate, according to some embodiments.

FIG. 4 illustrates process flow diagram of a method 400 of processing a substrate in some embodiments. The method includes at activity 402, depositing a nucleation layer by exposing the substrate to gaseous precursors using a gas delivery system.

At activity 404, the nucleation layer on the substrate is exposed to a radical species. In some embodiments, exposing the substrate to the radical species includes exposing a center portion of the substrate to the radical species. The inner region can be exposed for about 5 second to about 15 seconds, such as about 10 seconds, at a pressure of about 0.5 Torr to about 2 Torr. The radical species can be generated and delivered from a remote plasma source. In some embodiments, a purge gas, such as argon gas is provided to the edge portion of the substrate while the center portion is being exposed to a radical species.

In some embodiments, the remote plasma source can be shut off or diverted such that the substrate is not being exposed to additional radical species for about 5 seconds or less, such as about 2 seconds to about 4 seconds. The radical species is delivered to the substrate using the center manifold to a center opening in the lid plate.

In some embodiments, after exposing the center portion of the substrate and after shutting of the plasma source, an edge portion of the substrate is exposed to a gas for about 1 second to about 5 seconds, such as about 2 seconds to about 3 seconds. In some embodiments, the gas is a nonreactive gas, such as argon. In some embodiments, after exposing the edge portion to the gas, the edge portion of the substrate can be exposed to a radical species for about 5 second to about 15 seconds, such as about 10 seconds, at a pressure of about 0.5 Torr to about 2 Torr. The radical species is delivered to the substrate using the edge manifold to a plurality of edge holes in the lid plate. In some embodiments, a purge gas, such as argon gas is provided to the center portion of the substrate while the edge portion is being exposed to a radical species.

At activity 406, a bulk layer is deposited over the plasma treated nucleation layer. In some embodiments, the bulk layer is deposited by providing process gases through a center manifold of the assembly. In some embodiments, the process gases are provided through the edge manifold in addition to the center manifold It has been discovered that flowing plasma at a single point source to a center of the substrate, such as using conventional methods, enables the bulk film thickness to deposit in the center of the substrate, but taper at the edge of the substrate such that film thickness is much lower at the edge of the substrate relative to the center of the substrate. For example, for a substrate having a 150 mm radius, an outermost 50 mm of the substrate radius of a comparative sample had a thickness of about 25% to about 45% less than a thickness measured at a center of the substrate. In contrast, substrates processed using the systems and methods provided herein demonstrated a substantially uniform substrate thickness over the entire substrate. The stack film (combination of nucleation layer from 402, plasma treatment from 404 and deposited bulk layer from 406) described herein demonstrated a difference in thickness at an outermost 50 mm of the substrate radius of less than 25%, such as about 5% to about 20%, relative to a thickness of the substrate at the center of the substrate.

While the foregoing is directed to embodiments of the present disclosure, other and further embodiments of the disclosure may be devised without departing from the basic scope thereof, and the scope thereof is determined by the claims that follow.

What is claimed is:

1. A substrate processing system, comprising: a processing chamber, comprising a lid plate, one or more chamber sidewalls, and a chamber base that collectively define a processing volume, the lid plate comprising a center gas inlet extending through the lid plate; an annular plate coupled to the lid plate, the annular plate comprising: a first outer surface and a second outer surface opposite the first outer surface; a central opening extending from the first outer surface to the second outer surface, wherein the central opening is coaxial to the center gas inlet; an inner channel disposed outwardly of the central opening; a plurality of intermediate channels disposed outwardly of the inner channel; an outer channel disposed outwardly of the plurality of intermediate channels; and one or more openings formed within the outer channel; an edge manifold fluidly coupled to the processing chamber through the annular plate and the lid plate; and a center manifold directly coupled to the lid plate, wherein the center manifold extends through the central opening of the annular plate; a blocker plate coupled to the lid plate on a side opposing the annular plate.

2. The substrate processing system of claim 1, wherein the inner channel, the plurality of intermediate channels, and the outer channel are in fluid communication with the edge manifold and an edge gas hole disposed through the lid plate.

3. The substrate processing system of claim 2, wherein the edge gas hole of the lid plate is fluidly coupled to an edge region of the blocker plate, the blocker plate further comprising a center region fluidly isolated from the edge region.

4. The substrate processing system of claim 3, further comprising a valve assembly capable of switching a gas flow provided to the edge region of the blocker plate and the center region of the blocker plate.

5. The substrate processing system of claim 1, wherein the outer channel is fluidly coupled to edge gas holes in a lid interfacing surface of the annular plate.

6. A gas delivery system comprising:

a lid plate having a first major surface and a second major surface opposing the first major surface, the lid plate comprising a center gas inlet extending through the lid plate;

an annular plate coupled to the first major surface of the lid plate, the annular plate comprising:

a first outer surface and a second outer surface opposite the first outer surface;

a central opening extending from the first outer surface to the second outer surface, wherein the central opening is coaxial to the center gas inlet;

an inner channel disposed outwardly of the central opening;

a plurality of intermediate channels disposed outwardly of the inner channel;

an outer channel disposed outwardly of the plurality of intermediate channels; and one or more openings formed within the outer channel;

a blocker plate coupled to the second major surface of the lid plate;

a center manifold fluidly coupled to an opening of the lid plate, wherein the center manifold extends through the central opening of the annular plate; and an edge manifold fluidly coupled to the center manifold and the annular plate.

7. The gas delivery system of claim 6, further comprising a showerhead coupled to the blocker plate.

8. The gas delivery system of claim 6, wherein the lid plate comprises a plurality of edge gas holes extending from the first major surface to the second major surface of the lid plate.

9. The gas delivery system of claim 8, wherein the plurality of edge gas holes are angled radially inward from the first major surface to the second major surface.

10. The gas delivery system of claim 8, wherein each inlet of each edge gas hole is in fluid communication with the inner channel, the plurality of intermediate channels, and the outer channel of the annular plate.

11. The gas delivery system of claim 6, wherein the blocker plate comprises an edge region defined between an outer circumferential edge of the blocker plate and an inner circumferential partition of the blocker plate.

12. The gas delivery system of claim 11, wherein the edge region comprises a plurality of segments separated by dividers.

13. A processing chamber, comprising:

a base;

one or more sidewalls coupled to the base;

a lid assembly coupled to the one or more sidewalls disposed opposite to the base, the lid assembly comprising:

a lid plate comprising a center gas inlet extending through the lid plate;

an annular plate coupled to the lid plate, the annular plate comprising:

a first outer surface and a second outer surface opposite the first outer surface;

a central opening extending from the first outer surface to the second outer surface, wherein the central opening is coaxial to the center gas inlet;

an inner channel disposed outwardly of the central opening;

a plurality of intermediate channels disposed outwardly of the inner channel;

an outer channel disposed outwardly of the plurality of intermediate channels; and one or more openings formed within the outer channel;

an edge manifold fluidly coupled to the processing chamber through the annular plate and the lid plate; and a center manifold fluidly coupled to a center gas inlet disposed in the lid plate, wherein the center manifold extends through the central opening of the annular plate; and a blocker plate coupled to the lid plate on a side opposing the annular plate.

14. The processing chamber of claim 13, wherein the edge manifold is fluidly coupled to the one or more openings.

15. The processing chamber of claim 14, wherein an edge gas hole of the lid plate is fluidly coupled to an edge region of the blocker plate, the blocker plate further comprising a center region fluidly isolated from the edge region.

16. The processing chamber of claim 15, further comprising a valve assembly capable of switching a gas flow provided to the edge region of the blocker plate and the center region of the blocker plate.

17. The processing chamber of claim 16, wherein the one or more openings formed within the outer channel are fluidly coupled to the edge gas hole of the lid plate.

* * * * *